(12) United States Patent
Hongo et al.

(10) Patent No.: US 9,253,899 B2
(45) Date of Patent: Feb. 2, 2016

(54) ELECTRONIC DEVICE AND ELECTRONIC DEVICE MANUFACTURING METHOD

(71) Applicant: FUJITSU LIMITED, Kawasaki-shi, Kanagawa (JP)

(72) Inventors: Manabu Hongo, Kawasaki (JP); Yoshifumi Kajiwara, Sapporo (JP); Hiroyuki Takita, Sapporo (JP); Hiroshi Kubo, Sapporo (JP); Satoshi Watanabe, Setagaya (JP); Shingo Yamaguchi, Kawasaki (JP); Satoshi Kanbayashi, Kawasaki (JP); Yasuhiro Ite, Chofu (JP)

(73) Assignee: FUJITSU LIMITED, Kawasaki (JP)

( * ) Notice: Subject to any disclaimer, the term of this patent is extended or adjusted under 35 U.S.C. 154(b) by 125 days.

(21) Appl. No.: 13/974,598

(22) Filed: Aug. 23, 2013

(65) Prior Publication Data

US 2014/0118906 A1    May 1, 2014

(30) Foreign Application Priority Data

Oct. 25, 2012    (JP) .................................. 2012-235652

(51) Int. Cl.
*H05K 5/00*    (2006.01)
*G06F 1/16*    (2006.01)
*H05K 5/02*    (2006.01)

(52) U.S. Cl.
CPC ............ *H05K 5/0004* (2013.01); *G06F 1/1626* (2013.01); *G06F 1/1656* (2013.01); *H05K 5/0208* (2013.01); *Y10T 29/49826* (2015.01)

(58) Field of Classification Search
CPC ... H05K 5/0004; H05K 5/0208; G06F 1/1626
USPC ...................................................... 361/679.21
See application file for complete search history.

(56) References Cited

U.S. PATENT DOCUMENTS

2006/0023431 A1 *   2/2006   Wetzel ................ B60R 16/0239
                                                            361/739
2010/0265656 A1    10/2010   Yamaguchi et al.

FOREIGN PATENT DOCUMENTS

| JP | 2005-93245 | 4/2005 |
|---|---|---|
| JP | 2010-251616 | 11/2010 |
| JP | 2011-86817 | 4/2011 |

* cited by examiner

*Primary Examiner* — Tuan T Dinh
*Assistant Examiner* — Rockshana Chowdhury
(74) *Attorney, Agent, or Firm* — Fujitsu Patent Center

(57) ABSTRACT

An electronic device including: a protrusion portion that projects towards a bottom face of a groove from the opposite side face of a second hook portion, that is inserted into the groove, and that makes close contact with a sealing material; and a cut-away portion that is formed to a side wall portion positioned further to the casing inside out of a pair of side wall portions forming the groove, the cut-away portion being formed at a position corresponding to a first hook portion.

5 Claims, 8 Drawing Sheets

9,253,899 B2

ELECTRONIC DEVICE AND ELECTRONIC DEVICE MANUFACTURING METHOD

CROSS-REFERENCE TO RELATED APPLICATION

This application is based upon and claims the benefit of priority of the prior Japanese Patent Application No. 2012-235652, filed on Oct. 25, 2012, the entire contents of which are incorporated herein by reference.

FIELD

The embodiments discussed herein are related to an electronic device and an electronic device manufacturing method.

BACKGROUND

Electronic devices are known that include a first case formed with a groove, a sealing material filled into the groove, and a second case with a protrusion portion that is inserted into the groove and is in close contact with the sealing material.

Related Patent Documents

Japanese Laid-Open Patent Publication No. 2011-86817

SUMMARY

According to an aspect of the embodiments, an electronic device includes: a first case formed with a groove; a second case that together with the first case forms a casing; a viscous sealing material filled in the groove; a first hook portion that projects towards the casing inside from a first wall portion formed to the first case further to the casing outside than the groove; a second hook portion that projects towards the casing outside from a second wall portion formed to the second case further to the casing inside than the first wall portion, that fits together with the first hook portion, and that makes close contact with the sealing material at an opposite side face to a fitting face with the first hook portion; a protrusion portion that projects towards a bottom face of the groove from the opposite side face of the second hook portion, that is inserted into the groove, and that makes close contact with the sealing material; and a cut-away portion that is formed to the side wall portion positioned further to the casing inside out of a pair of side wall portions forming the groove, the cut-away portion being formed at a position corresponding to the first hook portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Explanation follows regarding an exemplary embodiment of technology disclosed herein.

Figure 1:
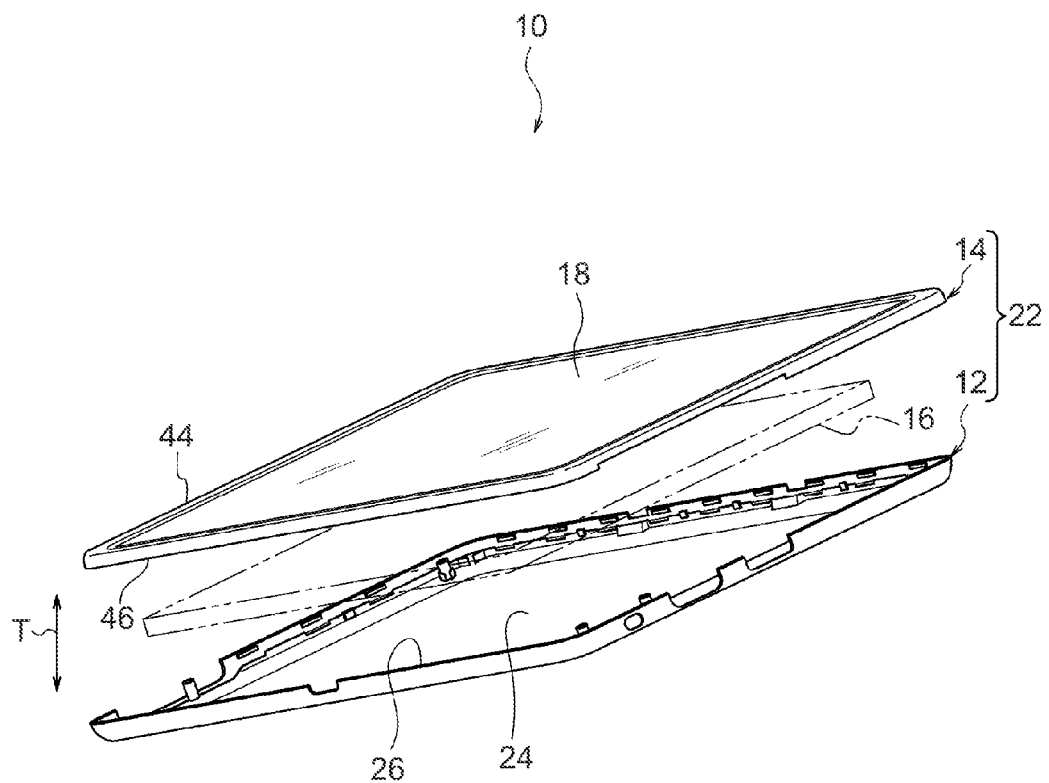
FIG. 1 is an exploded perspective view of an electronic device.

As illustrated in FIG. 1, an electronic device 10 according to the present exemplary embodiment includes a rear case 12, a front case 14, an internal unit 16, and a display 18.

The rear case 12 and the front case 14 form a casing 22 of the electronic device 10. The rear case 12 and the front case 14 are divided in the casing 22 thickness direction (the arrow T direction). The internal unit 16, including for example a control board and a battery, is housed inside the front case 14 and the rear case 12. The display 18, that is for example a liquid crystal display, is assembled to the front case 14. The display 18 is driven by the control board of the internal unit 16. Note that the rear case 12 is an example of a first case, and the front case 14 is an example of a second case.

Figure 2:
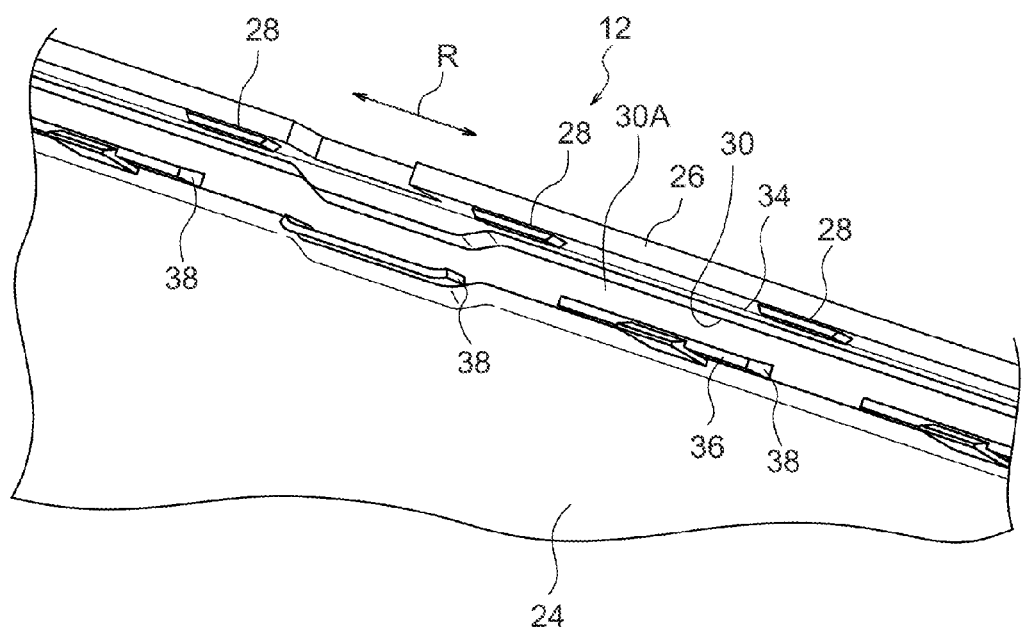
FIG. 2 is an enlarged perspective view of relevant portions of a rear case.
Figure 3:
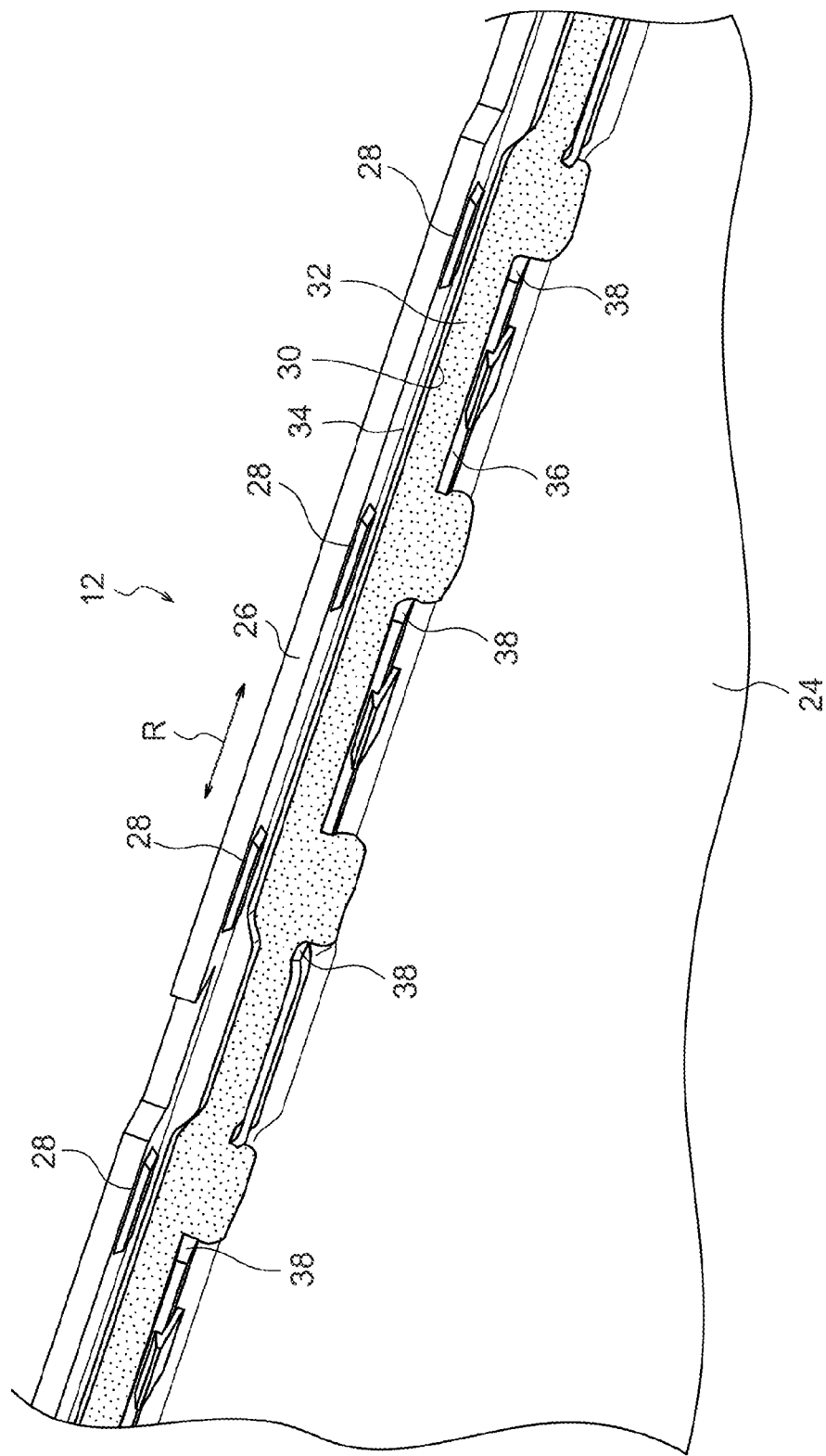
FIG. 3 is an enlarged perspective view of relevant portions of a rear case, illustrating a sealing material filled state of a groove.
Figure 6:
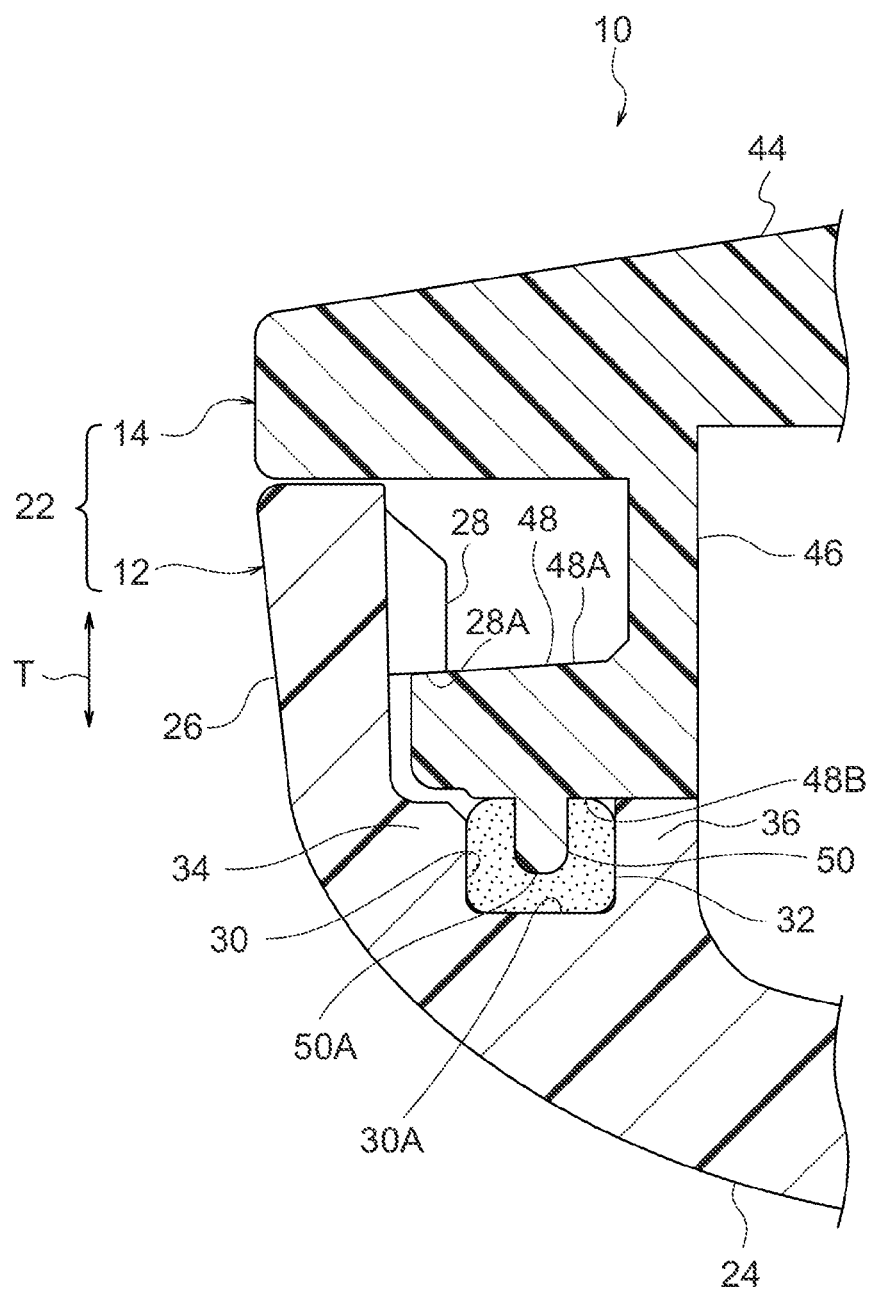
FIG. 6 is an enlarged vertical cross-section of relevant portions of a casing, taken at a position away from a first hook portion.
Figure 7:
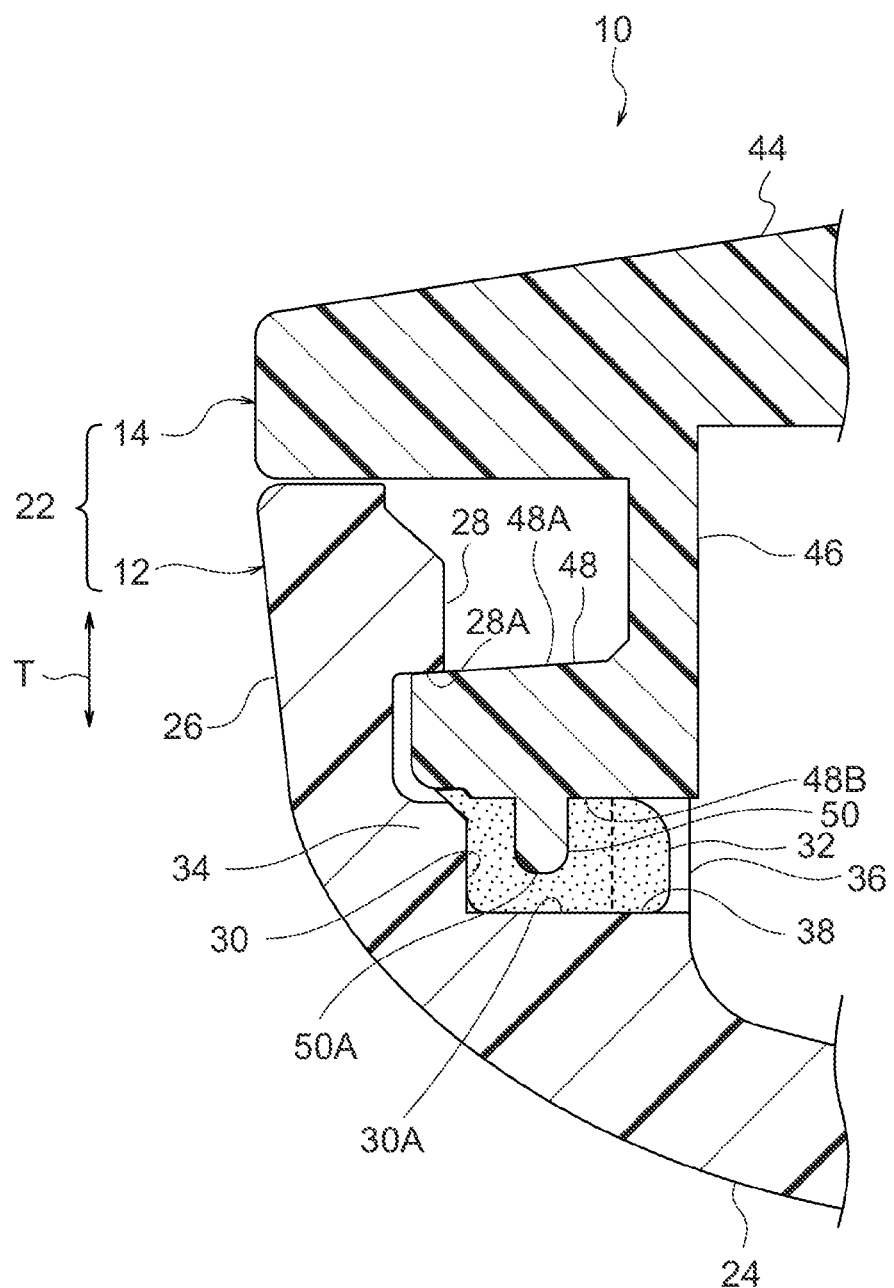
FIG. 7 is an enlarged vertical cross-section of relevant portions of a casing, taken at the position of a first hook portion.

The rear case 12 includes a main body portion 24 extending in both the length and width direction of the casing 22, and a first wall portion 26 formed at an outer peripheral portion of the main body portion 24. The first wall portion 26 extends in the casing 22 thickness direction (the arrow T direction), that is the assembly direction of the rear case 12 and the front case 14, along the sides of the front case 14, and is formed at a peripheral edge portion around the entire perimeter of the rear case 12. As illustrated in FIG. 6 and FIG. 7, a leading end portion of the first wall portion 26 is formed with plural first hook portions 28 that project out towards the casing 22 inside. As illustrated in FIG. 2 and FIG. 3, the plural first hook portions 28 are formed at mutual separations along a direction (the arrow R direction) following the peripheral edge portion of the rear case 12.

Moreover, as illustrated in FIG. 6, the main body portion 24 of the rear case 12 is formed with a groove 30 that is open towards the front case 14 side. The groove 30 is positioned further to the casing 22 inside than the first wall portion 26, and is formed in a ring shape around the peripheral edge portion of the rear case 12 (see FIG. 2 to FIG. 4). The groove 30 is filled with a sealing material 32 around the entire perimeter of the groove 30. The sealing material 32 is viscous and adhesive and is filled into the groove 30 by extrusion from a container.

The first wall portion 26 projects up at a side wall portion 34 that, out of a pair of side wall portions 34, 36 that form the groove 30, is positioned towards the casing 22 outside. The first wall portion 26 is formed at a position towards the casing 22 outside of an upper edge of the side wall portion 34, with the thickness of the upper edge of the side wall portion 34 being thicker than the thickness of a lower edge of the first wall portion 26.

Figure 4:
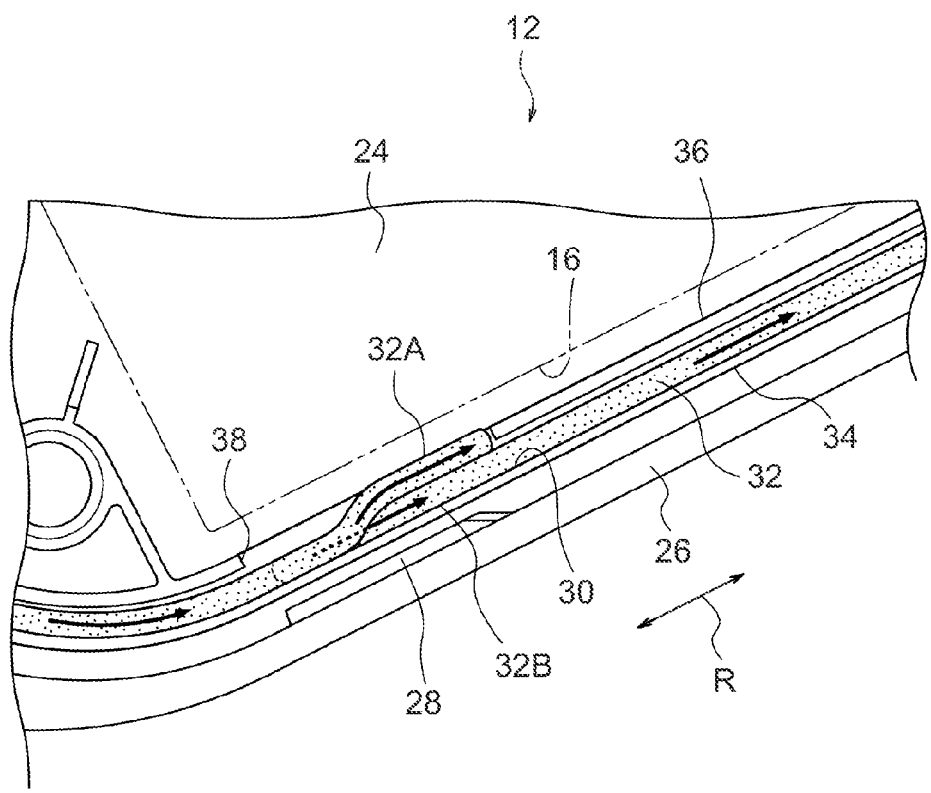
FIG. 4 is an enlarged perspective view of relevant portions of a rear case, illustrating a sealing material filled state of a groove at a different position to that illustrated in FIG. 3.
Figure 5:
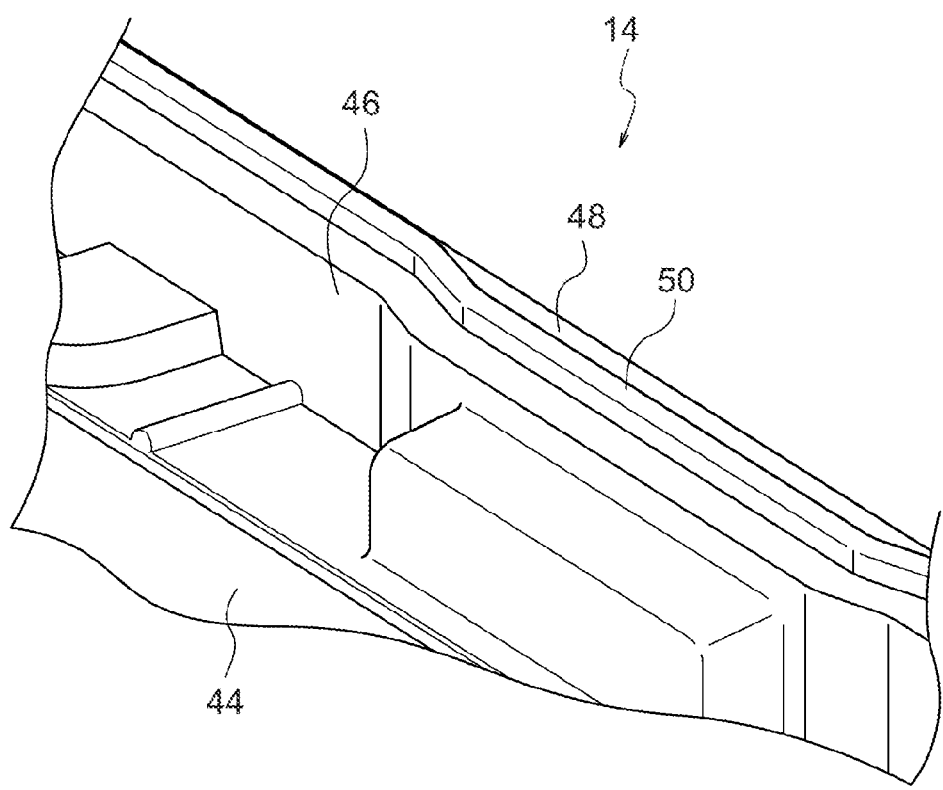
FIG. 5 is an enlarged perspective view of relevant portions of a front case.

As illustrated in FIG. 2 to FIG. 4, plural cut-away portions 38 are formed to the side wall portion 36 that, out of the pair of side wall portions 34, 36 that form the groove 30, is positioned on the casing 22 inside. The plural cut-away portions 38 are formed separated from each other along a direction along the peripheral edge portion of the rear case 12. Each of the plural cut-away portions 38 is formed at a position corresponding to the first hook portions 28 on the side wall portion 36, namely at positions overlapping with the first hook portions 28 along the direction around the rear case 12 peripheral edge portion. Each of the plural cut-away portions 38 is cut away from upper edge side of the side wall portion 36 and penetrates the side wall portion 36 in the projection direction of the first hook portions 28 (the side wall portion 36 thickness direction).

As illustrated in FIG. 6 and FIG. 7, the front case 14 includes a main body portion 44 that faces the main body portion 24 of the rear case 12, and a second wall portion 46 that extends from the main body portion 44 towards the rear case 12 side in the casing 22 thickness direction (in the arrow T direction). The second wall portion 46 is formed in a ring shape following the first wall portion 26, and is positioned further towards the casing 22 inside than the first wall portion 26. The second wall portion 46 is formed over an extension line of the side wall portion 36.

A second hook portion 48 is formed to a leading end portion (a rear case 12 side lower end portion) of the second wall portion 46 so as to project towards the casing 22 outside. The second hook portion 48 is formed around the entire periphery of the second wall portion 46. A leading end of the second hook portion 48 is positioned further towards the casing 22 outside than the groove 30. Namely, the second hook portion 48 is set with a size and position so as to block off the groove 30. The second hook portion 48 fits together (anchors) with the first hook portions 28 from the groove 30 side in the casing 22 thickness direction. The front case 14 and the rear case 12 are thereby assembled together due to the first hook portions 28 and the second hook portion 48 thus fitting together with each other.

In the fitted together state of the first hook portions 28 and the second hook portion 48, an opposite side face 48B of the second hook portion 48 to a fitting face 48A is in close contact with the sealing material 32. A protrusion portion 50 projects out from the opposite side face 48B of the second hook portion 48 towards a bottom face 30A of the groove 30. The protrusion portion 50 is inserted into the groove 30 in the fitted together state of the first hook portions 28 and the second hook portion 48, the protrusion portion 50 making close contact with the sealing material 32. The forming position of the protrusion portion 50 is set such that the protrusion portion 50 is inserted into a central portion of the groove 30 between the pair of side wall portions 34, 36. The protrusion portion 50 moreover projects straight towards the bottom face 30A of the groove 30, and a leading end portion 50A of the protrusion portion 50 is formed by a curved protruding face that forms a protrusion towards the bottom face 30A side of the groove 30.

Explanation follows regarding a manufacturing method of the electronic device 10 according to the present exemplary embodiment.

First, as illustrated in FIG. 3, the sealing material 32 is filled into the groove 30 around the entire periphery of the groove 30. In consideration of variations in the application amount of the sealing material 32, the sealing material 32 is generously applied such that it bulges out slightly from the plural cut-away portions 38. As illustrated in FIG. 4, the sealing material 32 is applied from a position corresponding to one of the cut-away portions 38 out of the plural cut-away portions 38 around the entire perimeter of the groove 30.

A finishing point portion 32A of the sealing material 32 bulges out from the groove 30 towards the casing 22 inside through the one cut-away portions 38 mentioned above. The finishing point portion 32A moreover overlaps with a starting point portion 32B of the sealing material 32 positioned inside the groove 30. Namely, the finishing point portion 32A of the sealing material 32 overlaps with the starting point portion 32B of the sealing material 32 in the groove 30 length direction (the arrow R direction), with the finishing point portion 32A in a side-by-side state with the starting point portion 32B of the sealing material 32 and in close contact with the starting point portion 32B.

Figure 8:
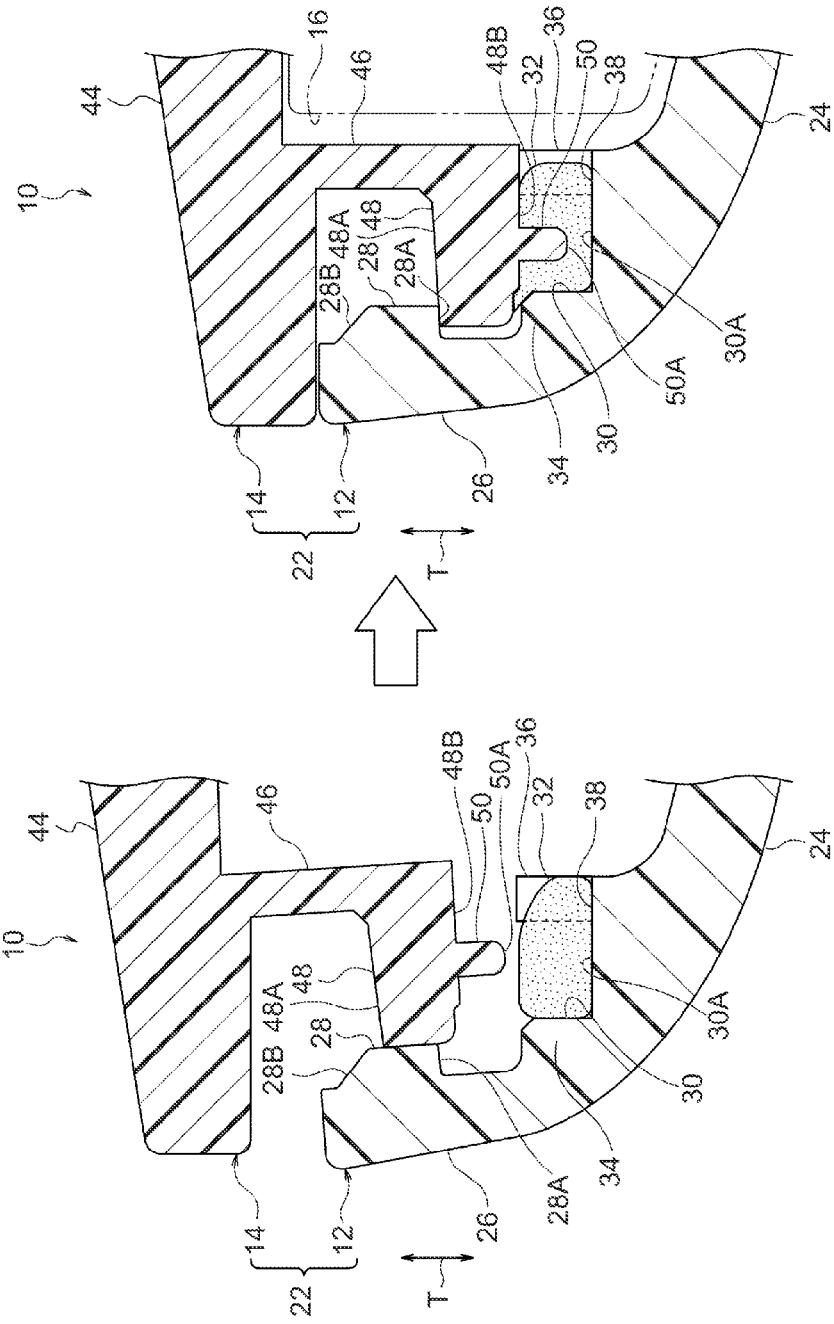
FIG. 8 is a drawing to explain how a rear case and a front case are assembled together.

Next, as illustrated on the left side of FIG. 8, the rear case 12 and the front case 14 are brought towards each other, and the leading end portion of the second hook portion 48 over-rides opposite side faces 28B to fitting faces 28A of the first hook portions 28. The leading end portions of the first hook portions 28 attain an abutted state with the leading end portion of the second hook portion 48. The first wall portion 26 and the second wall portion 46 thereby attain a flexed state. Namely, the first wall portion 26 flexes towards the casing 22 outside, and the second wall portion 46 flexes towards the casing 22 inside. When the first wall portion 26 flexes towards the casing 22 outside, the side wall portion 34 where the first wall portion 26 is formed is pulled towards the casing 22 outside, and the first wall portion 26 flexes towards the casing 22 outside.

Then, as illustrated on the right side of FIG. 8, the first hook portions 28 and the second hook portion 48 fit together with each other when the second hook portion 48 over-rides the first hook portions 28, and the opposite side face 48B to the fitting face 48A of the second hook portion 48 makes close contact with the sealing material 32. When the first hook portions 28 and the second hook portion 48 fit together in this way, the protrusion portion 50 is inserted into the groove 30, and the protrusion portion 50 makes close contact with the sealing material 32. Moreover, the flexing of the first wall portion 26 and the second wall portion 46 is relaxed when the first hook portions 28 and the second hook portion 48 fit together with each other (when the respective leading end portions are released from their abutted state). The front case 14 and the rear case 12 are thereby assembled together due to the first hook portions 28 and the second hook portion 48 thus fitting together with each other.

Note that explanation has been given above of an assembly process of the casing 22. However in the manufacturing method of the electronic device 10, members including the internal unit 16 and the display 18 (described above, see FIG. 1) are also assembled to the casing 22 at an appropriate stage in the casing 22 assembly process. The electronic device 10 is thereby manufactured in this manner.

Explanation follows regarding operation and advantageous effects of the present exemplary embodiment.

As has been explained in detail above, as illustrated in FIG. 6, in the present exemplary embodiment the protrusion portion 50 projects out from the opposite side face 48B to the fitting face 48A of the second hook portion 48 towards the bottom face 30A of the groove 30. The protrusion portion 50 is inserted into the groove 30 in the fitted together state of the first hook portions 28 and the second hook portion 48, making close contact with the sealing material 32. The close contact surface area between the sealing material 32 and the front case 14 can accordingly be enlarged by the protrusion portion 50. Accordingly, even if for example there is variation in the assembly precision or the dimensional precision of the rear case 12 and the front case 14, the effects of such variation can be eliminated whilst also stopping water.

As illustrated in FIG. 7, the cut-away portions 38 are formed to the side wall portion 36 that, out of the pair of side wall portions 34, 36 that form the groove 30, is positioned on the casing 22 inside. Accordingly, even when for example the sealing material 32 is applied generously in consideration of variations in the application amount of the sealing material 32, a portion of the sealing material 32 moves through the cut-away portions 38 towards the casing 22 inside. The sealing material 32 can thereby be suppressed from bulging out to the casing 22 outside, thus securing the appearance of the electronic device 10.

As illustrated in FIG. 8, when the leading end portions of the first hook portions 28 and the leading end portion of the second hook portion 48 abut each other during assembly of the rear case 12 to the front case 14, the first wall portion 26 and the second wall portion 46 respectively attain a flexed state at positions corresponding to the first hook portions 28. Note that the cut-away portions 38 are formed at positions in the side wall portion 36 corresponding to the first hook portions 28. When the flexing of the second wall portion 46 is relaxed due to the second hook portion 48 over-riding the first hook portions 28, the portion of the sealing material 32 that has moved towards the casing 22 inside through the cut-away portions 38 is pulled towards the inside of the groove 30 by the movement of the second hook portion 48 towards the casing 22 outside. The close contact surface area of the second hook portion 48 and the protrusion portion 50 against the sealing material 32 can accordingly be secured on the casing 22 inside of the protrusion portion 50.

Namely, supposing the cut-away portions 38 were not formed to the side wall portion 36, the sealing material 32 would be pushed towards the casing 22 outside by the movement of the second hook portion 48 towards the casing 22 outside, and the amount of the sealing material 32 to the casing 22 inside of the protrusion portion 50 would decrease. In particular, when the leading end portions of the first hook portions 28 abutted the leading end portion of the second hook portion 48, the side wall portion 34 would flex towards the casing 22 outside together with the first wall portion 26, and the amount of the sealing material 32 moving towards the casing 22 outside would increase. The amount of the sealing material 32 to the casing 22 inside of the protrusion portion 50 would accordingly decrease even further. There would accordingly be the concern of the close contact surface area of the second hook portion 48 and the protrusion portion 50 against the sealing material 32 decreasing on the casing 22 inside of the protrusion portion 50.

However, as described above in the present exemplary embodiment, a portion of the sealing material 32 initially bulges out towards the casing 22 inside through the cut-away portions 38, after which this portion of the sealing material 32 is pulled back inside the groove 30 employing the movement of the second hook portion 48 towards the casing 22 outside. The close contact surface area of the second hook portion 48 and the protrusion portion 50 against the sealing material 32 can accordingly be secured not only at the casing 22 outside of the protrusion portion 50 but also at the casing 22 inside of the protrusion portion 50. The water resistance performance of the sealing material 32 can be enhanced as a result.

Moreover, since the portion of the sealing material 32 that has moved towards the casing 22 inside through the cut-away portions 38 can be pulled back inside the groove 30 as described above, contact between the sealing material 32 and the internal unit 16 can be suppressed. Damage to the internal unit 16 can accordingly be suppressed.

In particular, as illustrated in FIG. 4, the starting point portion 32B and the finishing point portion 32A of the sealing material 32 are overlapped with each other. The amount of the sealing material 32 at the cut-away portion 38 out of the plural cut-away portions 38 that is positioned at the overlapping portion of the starting point portion 32B and the finishing point portion 32A of the sealing material 32 accordingly increases. However as described above, in the electronic device 10 the portion of the sealing material 32 that has moved through the cut-away portions 38 towards the casing 22 inside can be pulled back inside the groove 30 by the movement of the second hook portion 48 towards the casing 22 outside (see FIG. 8). Since the overlapping portion of the starting point portion 32B and the finishing point portion 32A of the sealing material 32 can be pulled back towards the casing 22 outside, the overlapping portion of the starting point portion 32B and the finishing point portion 32A can be suppressed from contacting the internal unit 16.

The sealing material 32 is moreover applied in a ring shape around the entire perimeter of the groove 30. Breaks (joints) in the sealing material 32 can accordingly be suppressed from forming. Water can accordingly be suppressed from penetrating to the inside of the sealing material 32.

Moreover, as illustrated in FIG. 6, the protrusion portion 50 described above is inserted into the central portion of the groove 30 between the pair of side wall portions 34, 36. The sealing material 32 can accordingly be disposed with good balance on both sides of the protrusion portion 50.

The protrusion portion 50 moreover projects straight towards the bottom face 30A of the groove 30. Uneven distribution of the sealing material 32 on the two sides of the protrusion portion 50 can accordingly be suppressed.

The leading end portion 50A of the protrusion portion 50 is formed as a curved protruding face forming a protrusion towards the bottom face 30A side of the groove 30. The pressing load that acts on the sealing material 32 from the leading end portion 50A of the protrusion portion 50 can accordingly be distributed, thereby enabling for example the formation of cracks in the sealing material 32 to be suppressed.

Explanation follows regarding modified examples of the present exemplary embodiment.

In the present exemplary embodiment, the first hook portions 28 and the groove 30 are formed to the rear case 12, and the second hook portion 48 is formed to the front case 14. However, the first hook portions 28 and the groove 30 may be formed to the front case 14, and the second hook portion 48 may be formed to the rear case 12. In such cases, the rear case 12 is an example of the second case, and the front case 14 is an example of the first case.

The rear case 12 and the front case 14 are divided in the casing 22 thickness direction (the arrow T direction), however the rear case 12 and the front case 14 may be divided along another direction.

During assembly of the rear case 12 and the front case 14, both the first wall portion 26 and the second wall portion 46 are flexed due to the abutted state of the leading end portions of the first hook portions 28 against the leading end portion of the second hook portion 48. However configuration may be made such that only the second wall portion 46 flexes, for example by setting a higher bending rigidity for the first wall portion 26 than for the second wall portion 46.

The pair of side wall portions 34, 36 that form the groove 30 are configured with substantially the same height as each other, however the pair of side wall portions 34, 36 do not have to be the same height as each other.

The electronic device 10 is provided with the display 18, however the display 18 may be omitted.

Note that the plural modified examples described above may be combined as appropriate.

Explanation has been given of an exemplary embodiment of technology disclosed herein, however the technology disclosed herein is not limited to the above, and obviously various other modifications other than those described above may be implemented within a range not departing from the spirit of the technology disclosed herein.

According to the technology disclosed herein, water resistance performance of a sealing material can be enhanced.

All cited documents, patent applications and technical standards mentioned in the present specification are incorporated by reference in the present specification to the same extent as if the individual cited documents, patent applications and technical standards were specifically and individually incorporated by reference in the present specification.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device, comprising:
   a first case;
   a second case that together with the first case forms a casing;
   a groove that is formed in the first case and that extends along a peripheral part of the first case;
   a viscous sealing material filled in the groove;
   a first wall portion that is formed to the first case further to the casing outside than the groove and that extends along the peripheral part of the first case;
   a second wall portion that is formed to the second case further to the casing inside than the groove and that extends along the first wall portion;
   a plurality of first hook portions that are formed at intervals in a direction along the peripheral part of the first case and that project towards a side of the second wall portion from the first wall portion;
   a second hook portion that projects towards a side of the first wall portion from the second wall portion, that fits together with the plurality of first hook portions from a side of the groove, and that makes close contact with the sealing material at an opposite side face to a fitting face with the plurality of first hook portions;
   a protrusion portion that projects towards a bottom face of the groove from the opposite side face of the second hook portion, that is inserted into the groove, and that makes close contact with the sealing material; and
   a plurality of cut-away portion portions that are formed to the side wall portion positioned further to the casing inside out of a pair of side wall portions forming the groove, that are formed at positions corresponding to each of the plurality of first hook portions in a direction along the peripheral part of the first case, and that penetrate in a projection direction of the plurality of first hook portions.

2. The electronic device of claim 1, wherein:
   the groove is formed in a ring shape around a peripheral edge portion of the first case;
   the sealing material is filled around the entire perimeter of the groove; and
   a finishing point portion of the sealing material that bulges out from the groove through the cut-away portion towards the casing inside overlaps with a starting point portion of the sealing material positioned inside the groove.

3. The electronic device of claim 1, wherein the protrusion portion is inserted into a central portion inside the groove between the pair of side wall portions.

4. The electronic device of claim 3, wherein the protrusion portion projects straight towards the bottom face of the groove.

5. The electronic device of claim 3, wherein a leading end face of the protrusion portion is formed by a curved protruding face that forms a protrusion towards the bottom face side of the groove.

* * * * *